US005744195A

United States Patent [19]

Jin et al.

[11] Patent Number: 5,744,195

[45] Date of Patent: Apr. 28, 1998

[54] FIELD EMISSION DEVICES EMPLOYING ENHANCED DIAMOND FIELD EMITTERS

[75] Inventors: Sungho Jin, Millington; Gregory Peter Kochanski, Dunellen; Lawrence Seibles, Piscataway; Wei Zhu, North Plainfield, all of N.J.

[73] Assignee: Lucent Technologies Inc., Murray Hill, N.J.

[21] Appl. No.: 752,234

[22] Filed: Nov. 19, 1996

Related U.S. Application Data

[62] Division of Ser. No. 331,458, Oct. 31, 1994, Pat. No. 5,637,950.

[51] Int. Cl.$^6$ .............................. C23C 16/26; B05D 3/06

[52] U.S. Cl. .......................... 427/249; 427/533; 427/122; 313/311; 445/50

[58] Field of Search .................................. 427/249, 533, 427/122; 313/311; 445/50

[56] References Cited

U.S. PATENT DOCUMENTS

| | | | |
|---|---|---|---|
| 5,271,971 | 12/1993 | Herb et al. | 427/577 |
| 5,588,894 | 12/1996 | Jin et al. | 445/24 |
| 5,637,950 | 6/1997 | Jin et al. | 313/310 |
| 5,648,699 | 7/1997 | Jin et al. | 313/309 |

OTHER PUBLICATIONS

Chang et al. J. Appl. Phys. 71(6) Mar. 1992, pp. 2918–2923.

Ulczynski et al. Advances in New Diamond Sciencde and Technology Edited by Saito et al (1994) pp. 41–44.

Barnes et al. Appl. Phys. Lett. 62(1), Jan. 1993, pp. 37–39.

*Primary Examiner*—Roy V. King

*Attorney, Agent, or Firm*—Glen E. Books, Esq.

[57] ABSTRACT

Applicants have discovered methods for making, treating and using diamonds which substantially enhance their capability for low voltage emission. Specifically, applicants have discovered that defect-rich diamonds—diamonds grown or treated to increase the concentration of defects—have enhanced properties of low voltage emission. Defect-rich diamonds are characterized in Raman spectroscopy by a diamond peak at 1332 $cm^{-1}$ broadened by a full width at half maximum $\Delta K$ in the range 5–15 $cm^{-1}$ (and preferably 7–11 $cm^{-1}$). Such defect-rich diamonds can emit electron current densities of 0.1 $mA/mm^2$ or more at a low applied field of 25 V/μm or less. Particularly advantageous structures use such diamonds in an array of islands or particles each less than 10 μm in diameter at fields of 15 V/μm or less.

8 Claims, 2 Drawing Sheets

FIELD EMISSION DEVICES EMPLOYING ENHANCED DIAMOND FIELD EMITTERS

"This application is a division of application Ser. No. 08/331,458 filed Oct. 31, 1994, now U.S. Pat. No. 5,637, 950".

FIELD OF THE INVENTION

This invention pertains to field emission devices and, in particular, to field emission devices employing enhanced diamond field emitters for low voltage emission.

BACKGROUND OF THE INVENTION

A field emission device emits electrons in response to an applied electrostatic field. Such devices are useful in a wide variety of applications including displays, electron guns and electron beam lithography. A particularly promising application is the use of field emission devices in addressable arrays to make flat panel displays. See, for example, the December 1991 issue of *Semiconductor International*, p. 11; C. A. Spindt et al., IEEE Transactions on Electron Devices, Vol. 38 (10), pp. 2355–63 (1991); and J. A. Costellano, *Handbook of Display Technology*, Academic Press, New York, pp. 254–57 (1992), all of which are incorporated herein by reference.

A typical field emission device comprises a cathode including a plurality of field emitter tips and an anode spaced from the cathode. A voltage applied between the anode and cathode induces the emission of electrons towards the anode.

Conventional electron emission flat panel displays typically comprise a flat vacuum cell having a matrix array of microscopic field emitter tips formed on a cathode of the cell ("the back plate") and a phosphor-coated anode on a transparent front plate. Between cathode and anode is a conductive element called a "grid" or "gate". The cathodes and gates are typically intersecting strips (usually perpendicular strips) whose intersections define pixels for the display. A given pixel is activated by applying voltage between the cathode conductor strip and the gate conductor strip whose intersection defines the pixel. A more positive voltage is applied to the anode in order to impart a relatively high energy (400–1000 eV) to the emitted electrons. See, for example, U.S. Pat. Nos. 4,940,916; 5,129,850; 5,138,237; and 5,283,000, each of which is incorporated herein by reference.

Diamonds are desirable field emitters. Early field emitters were largely sharp-tipped structures of metal or semiconductor, such as Mo or Si cones. Such tips, however, are difficult to make, have insufficient durability for many applications, and require relatively high applied fields (about 100 V/μm) for electron emission. Diamonds, however, have structural durability and negative electron affinity—properties that make them attractive for field emission devices. Field emission devices employing diamond field emitters are disclosed, for example, in U.S. Pat Nos. 5,129, 850 and 5,138,237 and in Okano et al, *Vol.* 64, p. 2742 et seq. (1994), all of which are incorporated herein by reference. Flat panel displays which can employ diamond emitters are disclosed in co-pending U.S. Pat. application Ser. No. 08/220,077 filed by Eom et al on Mar. 30, 1994 now abandoned and U.S. patent applications Ser. No. 08/299,674 now abandoned and Ser. No. 08/299,470, now U.S. Pat. No. 5,504,385 both filed by Jin et al on Aug. 31, 1994. These three applications are incorporated herein by reference.

While diamonds offer substantial advantages as field emitters, it is highly desirable to employ diamond emitters capable of emission at voltages below those required by untreated diamonds. For example, flat panel displays typically require current densities of 0.1 mA/mm$^2$. If such emission densities can be achieved with an applied voltage below about 25 V, then low-cost CMOS driver circuitry can be used in the display. This typically requires emission at fields below about 25 V/μm. To achieve emission at such low fields, diamonds heretofore needed to be doped to n-type semiconductivity—a difficult and unreliable process. Accordingly, there is a need for improved diamond field emitters for low voltage emission.

SUMMARY OF THE INVENTION

Applicants have discovered methods for making, treating and using diamonds which substantially enhance their capability for low voltage emission. Specifically, applicants have discovered that defect-rich diamonds—diamonds grown or treated to increase the concentration of defects—have enhanced properties of low voltage emission. Defect-rich diamonds are characterized in Raman spectroscopy by a diamond peak at 1332 c$^{-1}$ broadened by a full width at half maximum ΔK in the range 5–15 cm$^{-1}$ (and preferably 7–11 cm$^{-1}$). Such defect-rich diamonds can emit electron current densities of 0.1 mA/mm$^2$ or more at a low applied field of 25 V/μm or less. Particularly advantageous structures use such diamonds in an array of islands or particles each less than 10 μm in diameter at fields of 15 V/μm or less.

BRIEF DESCRIPTION OF THE DRAWINGS

The nature, advantages and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
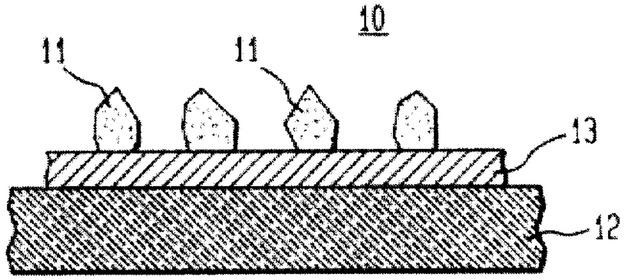
FIG. 1 is a schematic diagram of a first embodiment of a low voltage diamond emitter in accordance with the invention.

Referring to the drawings, FIG. 1 is a schematic cross section of a low voltage diamond emitter in accordance with a preferred embodiment of the invention. In essence, the structure 10 comprises a plurality of polyhedral diamond "islands" 11 grown on a substrate 12 which includes a conductive or semiconductive layer 13. The substrate 12 is preferably a metal such as Mo or a semiconductor such as Si. In the preferred embodiment, the diamond emitter material is in the form of defect-rich diamond islands 11 each less than 10 μm in diameter. The diamond emitting material is characterized by a broadened diamond peak at K=1332 cm$^{-1}$ in Raman spectroscopy with a full width at half maximum (FWHM) of ΔK in the range 5–15 cm$^{-1}$ and preferably 7–11

$cm^{-1}$. Such a broadened peak is characteristic of a highly defective diamond crystal structure rich in $sp^2$ bonds, vacancies and other point, line or surface defects. Such defect-rich diamond emitters have been found to emit electrons in useful current densities (≧0.1 $mA/mm^2$) at surprisingly low fields below the 25 V/μm. They typically emit at field levels below 20 V/μm and some have emitted as low as 12 V/μm. Advantageously, the diamond islands 11 contain sharp diamond points or facets.

Figure 2:
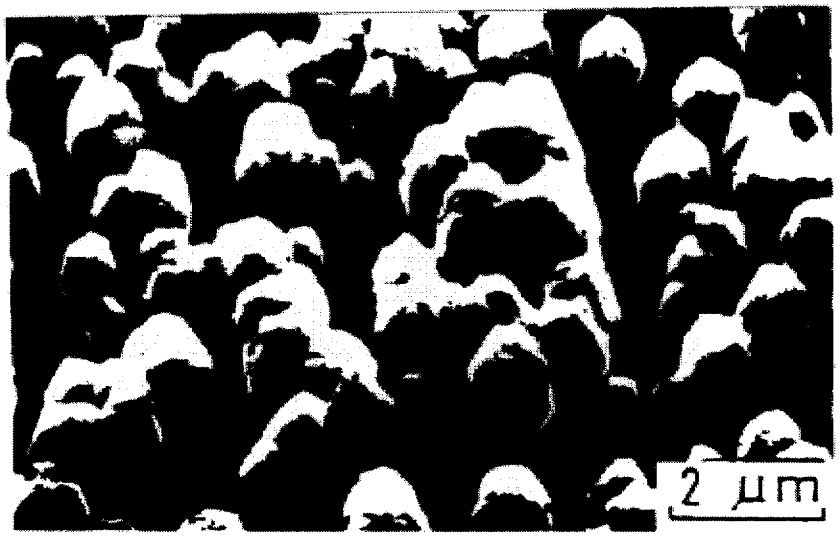
FIG. 2 is an SEM micrograph of an emitter similar to that shown in FIG. 1.

As a specific example, the SEM micrograph of FIG. 2 illustrates an emitter structure similar to FIG. 1 showing defect-rich diamond islands grown by microwave plasma-enhanced chemical vapor deposition (CVD) on a (100) silicon semiconducting substrate. A gas mixture of 1.0% methane in hydrogen at a flow rate of 200 cc/min was used for the CVD deposition at 900° C. for 7 hrs. In Raman spectroscopy analysis, the diamond peak at K=1332 $cm^{-1}$ was broadened to an FWHM of ΔK=9.4 $cm^{-1}$ indicative of a highly defective crystal structure. (This contrasts with defect-free single crystal diamond which usually exhibits a narrow FWHM of ΔK≦2 $cm^{-1}$) ). Electron emission occurred at about 25 V/μm.

The structure of FIG. 2 was then given an additional CVD deposition at 750° C. for 15 min using 8% methane in hydrogen. The resulting structure had a diamond Raman peak broadened to 10.2 $cm^{-1}$ which is indicative of a higher concentration of defects. Electron emission occurred at about 15 V/μm. Since a comparable CVD diamond structure with low defects (ΔK<5 $cm^{-1}$) either does not emit or requires a field of at least 70 V/μm, the defect-rich diamond of FIG. 2 exhibits substantially enhanced low voltage emission.

While the exact mechanism of this enhancement is not completely understood, it is believed due to fine defects ($sp^2$-bonds, point defects such as vacancies, and line defects such as dislocations) distributed in the diamond structure. Such defects in the predominantly $sp^3$ diamond tetrahedral structure form local energy bands close to or above the vacuum level to supply electrons for emission.

The island or particle geometry of defective diamonds is advantageous compared to other geometries such as continuous films. It is believed that diamond islands smaller than 10 μm in diameter (and preferably less than 2 μm in diameter) facilitate current flow from the underlying conductive layer to emission sites in the diamond so that stable emission can be sustained. The presence of sharp pointed features in diamond particles also lowers the emission voltage.

The preferred method for growing diamond emitter bodies is chemical vapor deposition either by using temperatures below those typically recommended for producing high quality, low defect, diamonds or by using a higher concentration of carbon in the CVD gas mixture. In the first approach, the deposition temperature, at least during the final stage of deposition, is maintained below 900° C. and preferably below about 800° C. so that a significant number of defects are incorporated into the $sp^3$ bonding structure of the diamond. The desirable range of defect density can be expressed in terms of the FWHM of the diamond peak in Raman spectroscopy as ΔK=5–15 $cm^{-1}$, and preferably 7–11 $cm^{-1}$. An upper limit on ΔK is desirable in order to maintain $sp^3$- dominated diamond structure for emitter durability. In the second approach, defect-rich diamond is obtained by maintaining the carbon concentration in the gaseous mixture above 0.5 atomic %, preferably above 1 atomic % and even more preferably above 2 atomic %. The preferred volume fraction of $sp^3$-type diamond phase in the emitter material is at least 70% by volume and preferably at least 85%.

As a step preliminary to growth, the substrate surface should be prepared to provide an appropriate density of nucleation sites. This preparation can be by any method known in the art, such as by polishing with diamond grit. Preferably the preparation conditions—whose process parameters are generally empirically determined—are selected to produce a diamond nucleation site density in the range $10^7$–$10^{10}$/$cm^2$.

After preparation of the substrate surface, the diamond islands are grown on the substrate. Growth can be by chemical vapor deposition assisted by microwave plasma, DC plasma, DC arc jet, combustion flame or hot filament. Growth typically is terminated well before substantial coalescence of the islands, resulting in a multiplicity of spaced apart, polyhedral diamond islands on the substrate. Many, if not all, of the islands will naturally have relatively sharp geometrical features, with at least some of the islands oriented such that the sharp features facilitate emission of electrons. Optionally the islands are formed in predetermined regions of the substrate, such that the desired array of pixels results. Such patterned deposition can be readily accomplished by means of an appropriate mask. Alternatively, a uniform distribution of islands is formed on the substrate, followed by patterning to yield the desired array of pixels. The average distance between neighboring islands is desirably at least half of the average island size, and preferably is equal to or greater than the latter. The spacing between islands facilitates provision of conductive paths to the islands, which in turn facilitates supplying current to the islands to sustain emission.

Figure 3:
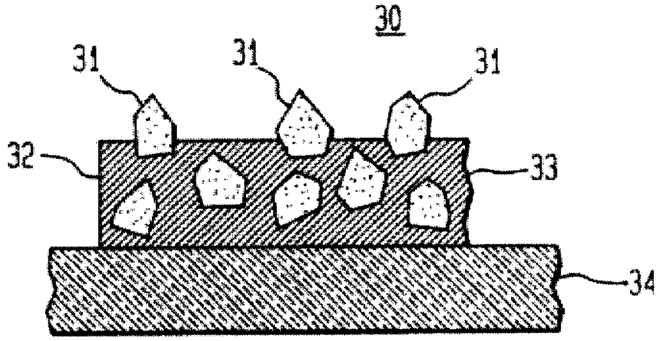
FIG. 3 is a schematic diagram of a second embodiment of a low voltage emitter.

FIG. 3 illustrates an alternative embodiment of a low voltage electron emitter 30 wherein defect-rich diamond particles 31 are disposed in columns or rows 32 of conductive matrix material 33 on a substrate 34. The diamond particles 31 can be synthesized under the CVD conditions described hereinabove or be defect-rich diamonds selected from low cost diamond grits.

The particles 31 can be disposed on substrate 34 by known techniques such as screen printing, electrophoresis, xerography, powder sprinkle coating and spray or spin coating followed by patterning. For example, the particles can be carried in a liquid medium such as acetone including an organic binder. Metal particles such as solder particles can be included. The mixture is spray coated onto the substrate 34 followed by heating to pyrolyze the binder and melt the solder to form matrix 33. Advantageously the material is selectively deposited or patterned into narrow columns or rows.

Other attachment techniques may also be considered. For example, solgel glass deposition (with optional inclusion of conductive metal particles), and metal deposition followed by etching, as disclosed in U.S. Pat. Nos. 5,199,918 and 5,341,063 may be employed. The defect-rich diamond may additionally be coated, at least partially, with an adhesion-enhancing coating such as Ti, W, Mo, Fe, Ta or alloys containing these elements (e.g. Cu-5% Ti). The improved adhesion is beneficial for good electrical conduction with a surrounding conductor matrix or conductive substrate. Part of the coating should be removed to expose the high-defect diamond surface for field emission, either by mechanical abrasion or by chemical etching.

Figure 4:
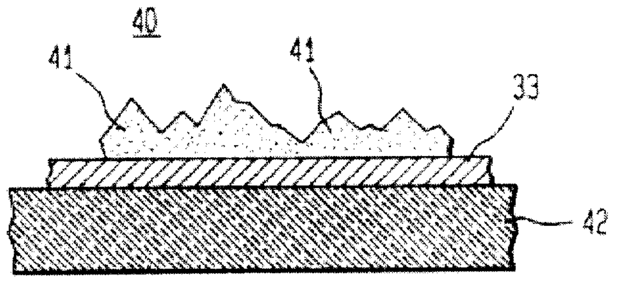
FIG. 4 is a schematic diagram of a third embodiment of a low voltage emitter.
Figure 5:
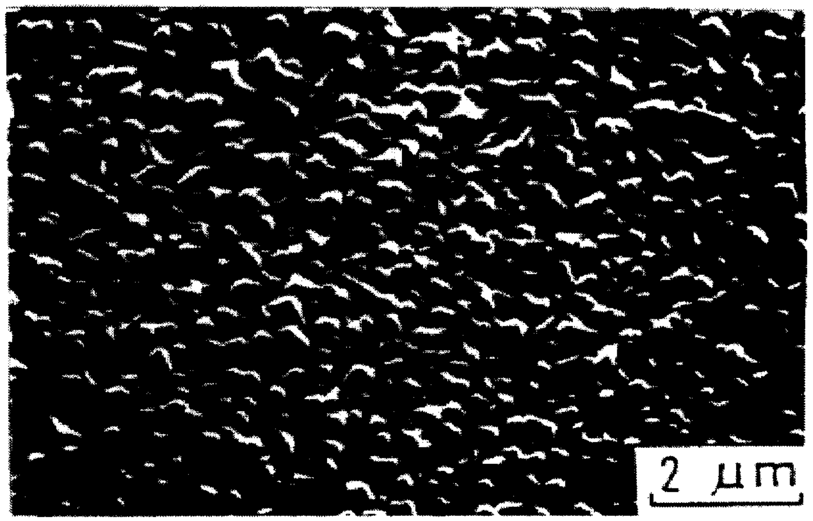
FIG. 5 is an SEM micrograph of an emitter similar to that shown in FIG. 4.

FIG. 4 shows an alternative embodiment of a low voltage electron emitter 40 which utilizes a continuous film of defect-rich diamond 41 on a conductive layer 33 of substrate 42. Such a film was grown by CVD with 2% $CH_4$ in $H_2$ at 900° C. for four hours. FIG. 5 is a SEM micrograph of the film. The Raman diamond peak showed FWHM of $\Delta K$=10.9 $cm^{-1}$, and electron emission occurred at 22 V/μm. It is desirable to utilize diamond films rich with sharp features such as facets, points and edges such as films of (110) textured diamond. (This contrasts with the relatively flat and smooth structures typically encountered in (100) textured growth and in diamond-like carbon (amorphic diamond). Techniques for growing sharp featured diamond films are described by C. Wild et al, "Oriented CVD Diamond Films," *Diamond and Related Materials*, Vol. 3, p. 373 (1994) which is incorporated herein by reference.

An alternative approach to introducing the desired defects is to form defects near the surface of the diamond emitters instead of throughout the whole volume. This can be done providing a substrate containing low-defect density ($\Delta K<5$ $cm^{-1}$), diamond islands, particles or films, and then selectively growing a defect-rich diamond layer on the surface of the low-defect diamonds. Such processing involves growing the diamond islands, particles or films in any fashion and then using a CVD deposition at low temperature (less than 900° C.) or at high carbon concentration (greater than 0.5 atomic % and preferably greater than 1 atomic %) to coat the high-defect density diamond layer on the surface. This approach has the advantage of combining the high concentration of sharp points (points having a radius of curvature less than 1000 Å and preferably less than 500 Å) found in low defect diamonds with the low field emission of defect-rich diamond material.

Another approach to introducing the desired defects in the surface region is to bombard diamond islands, particles or films with high energy particles (such as ions). For example, low temperature implanting of carbon, boron, sodium or phosphorous ions into the surface of the diamonds reduces the voltage required for field emission. The implantation is carried out at low temperatures—preferably room temperature—to maximize the number of defects produced and to minimize the mobility of the implanted ions. The desirable implantation dose is at least $10^{13}$ ions/$cm^2$ and preferably at least $10^{15}$/$cm^2$.

Figure 6:
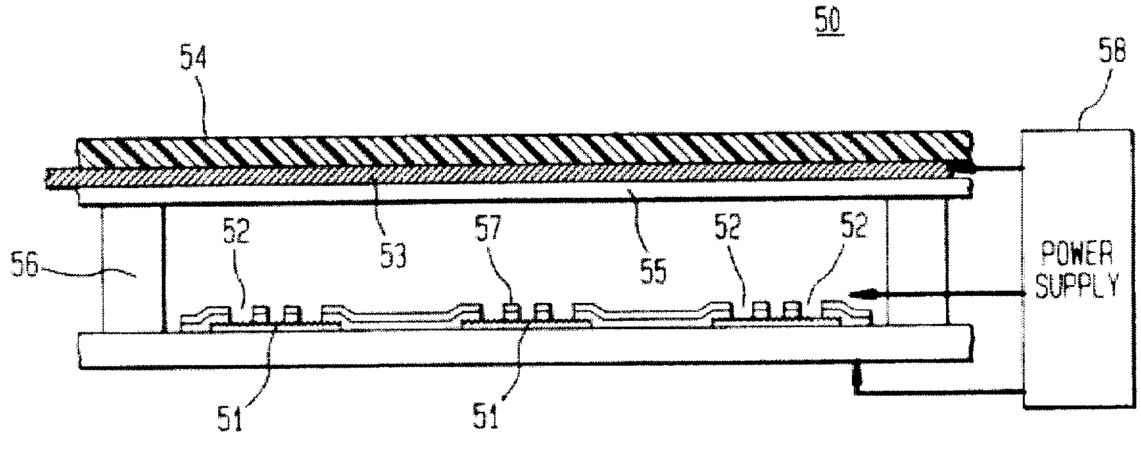
FIG. 6 is a schematic cross section of a field emission flat panel display using low voltage diamond emitters.

The preferred use of these low voltage diamond emitters is in the fabrication of field emission devices such as electron emission flat panel displays. FIG. 6 is a schematic cross section of an exemplary flat panel display 50 using low voltage diamond emitters. The display comprises a cathode 51 including a plurality of low voltage diamond emitters 52 and an anode 53 disposed in spaced relation from the emitters within a vacuum seal. The anode conductor 53 formed on a transparent insulating substrate 54 is provided with a phosphor layer 55 and mounted on support pillars 56. Between the cathode and the anode and closely spaced from the emitters is a perforated conductive gate layer 57.

The space between the anode and the emitter is sealed and evacuated, and voltage is applied by power supply 58. The field-emitted electrons from electron emitters 51 are accelerated by the gate electrode 57 from multiple emitting regions 52 on each pixel and move toward the anode conductive layer 53 (typically transparent conductor such as indium-tin-oxide) coated on the anode substrate 54. Phosphor layer 55 is disposed between the electron emitters and the anode. As the accelerated electrons hit the phosphor, a display image is generated.

While specific embodiments of the present invention are shown and described in this application, the invention is not limited to these particular forms. For example, the low voltage diamond field emitters can be used not only in flat-panel displays but also in a wide variety of other field emission devices including x-y matrix addressable electron sources, electron tubes, photocopiers and video cameras. The invention also applies to further modifications and improvements which do not depart from the spirit and scope of this invention.

We claim:

1. A method for making a diamond field emitter comprising the steps of:

providing a substrate;

growing diamond material on said substrate in the form of diamond islands less than 10 μm in diameter, said diamond material grown by CVD deposition of a gas consisting of more than 2 atomic percent of carbon in hydrogen at a temperature less than 900° C., whereby said diamond material is grown as diamond characterized by a broadband diamond peak at K=1332 $cm^{-1}$ in Raman spectroscopy with a full width at half maximum in the range 7–11 $cm^{-1}$;

said diamond material emitting electrons in a current density of at least 0.1 mA/$mm^2$ at an applied field of 25 V/μm or less.

2. The method of claim 1 wherein said CVD deposition is carried out using a gas mixture of methane and hydrogen.

3. The method of claim 1 wherein said substrate comprises Si or Mo.

4. The method of claim 1 wherein said diamond islands are less than 2 μm in diameter.

5. A method for making a diamond field emitter comprising the step of:

providing a substrate having diamond material thereon; and growing on said diamond material an additional layer of diamond electron emitting material characterized by a diamond peak at 1332 $cm^{-1}$ in Raman spectroscopy broadened to a full width at half maximum in the range 7–11 $cm^{-1}$, thereby growing a diamond material emitting electron in a current density of at least 0.1 mA/$mm^2$ at an applied field of 25V/μm or less.

6. The method of claim 5 wherein said providing a substrate comprises providing a substrate with diamond material having said peak with a full width at half maximum<5 $cm^{-1}$.

7. A method for making a diamond field emitter comprising the steps of:

providing a substrate having diamond material thereon; and bombarding said diamond material with particles to broaden the diamond peak at 1332 $cm^{-1}$ in Raman spectroscopy to a full width at half maximum in the range 5–15 $cm^{-1}$.

8. The method of claim 7 wherein said particles are carbon, boron, sodium or phosphorous ions.

* * * * *